United States Patent
Yin et al.

(10) Patent No.: US 11,069,808 B2
(45) Date of Patent: Jul. 20, 2021

(54) NEGATIVE CAPACITANCE FIELD EFFECT TRANSISTOR AND METHOD FOR MANUFACTURING THE SAME

(71) Applicant: Institute of Microelectronics, Chinese Academy of Sciences, Beijing (CN)

(72) Inventors: Huaxiang Yin, Beijing (CN); Qingzhu Zhang, Beijing (CN); Zhaohao Zhang, Beijing (CN); Tianchun Ye, Beijing (CN)

(73) Assignee: Institute of Microelectronics, Chinese Academy of Sciences, Beijing (CN)

(*) Notice: Subject to any disclaimer, the term of this patent is extended or adjusted under 35 U.S.C. 154(b) by 0 days.

(21) Appl. No.: 16/720,231

(22) Filed: Dec. 19, 2019

(65) Prior Publication Data

US 2020/0328309 A1   Oct. 15, 2020

(30) Foreign Application Priority Data

Apr. 11, 2019   (CN) .......................... 201910289934.4

(51) Int. Cl.
*H01L 29/78* (2006.01)
*H01L 29/66* (2006.01)

(52) U.S. Cl.
CPC .... *H01L 29/78391* (2014.09); *H01L 29/6684* (2013.01)

(58) Field of Classification Search
CPC ........... H01L 29/78391; H01L 29/6684; H01L 27/0924; H01L 21/823842; H01L 21/823821; H01L 29/516; H01L 29/513; H01L 21/823857

USPC .......................................................... 257/295
See application file for complete search history.

(56) References Cited

U.S. PATENT DOCUMENTS

| | | | | |
|---|---|---|---|---|
| 2010/0140589 | A1* | 6/2010 | Ionescu | H01L 29/7391 257/24 |
| 2012/0025327 | A1* | 2/2012 | Ji | H01L 21/283 257/411 |
| 2012/0261761 | A1* | 10/2012 | Wang | H01L 29/66545 257/368 |
| 2013/0270619 | A1* | 10/2013 | Schloesser | H01L 29/40111 257/295 |

(Continued)

*Primary Examiner* — Sheikh Maruf
(74) *Attorney, Agent, or Firm* — Goodwin Procter LLP

(57) ABSTRACT

A negative capacitance field effect transistor (NCFET) and a manufacturing method thereof. The NCFET includes: a substrate structure, including a MOS region; a gate insulating dielectric structure, covering the MOS region; and a metal gate stack layer, covering the gate insulating dielectric structure. The gate insulating dielectric structure includes an interface oxide layer, a $HfO_2$ layer, a doping material layer, and a ferroelectric material layer, which are sequentially stacked along a direction away from the substrate structure. A ferroelectric material in the ferroelectric material layer is $Hf_xA_{1-x}O_2$, A represents a doping element, and $0.1 \leq x \leq 0.9$. A material forming the doping material layer is $A_yO_z$ or A, and a ratio of y/z is equal to 1/2, 2/3, 2/5 or 1/1. Ferroelectric characteristics, material stability, and material reliability of the NCFET are improved by increasing domain polarity of the ferroelectric material.

13 Claims, 3 Drawing Sheets

(56) References Cited

U.S. PATENT DOCUMENTS

| | | | |
|---|---|---|---|
| 2015/0041925 A1* | 2/2015 | Zhu | H01L 29/78 257/411 |
| 2015/0287834 A1* | 10/2015 | Liao | C23C 14/165 257/295 |
| 2015/0380641 A1* | 12/2015 | Ino | C01G 27/00 257/4 |
| 2016/0155748 A1* | 6/2016 | Li | H01L 21/02181 257/295 |
| 2016/0172396 A1* | 6/2016 | Masuda | H01L 31/117 257/252 |
| 2017/0141235 A1* | 5/2017 | Lai | H01L 29/401 |
| 2018/0190785 A1* | 7/2018 | Hung | H01L 29/66575 |
| 2019/0074295 A1* | 3/2019 | Schroder | H01L 29/516 |
| 2019/0097061 A1* | 3/2019 | Ho | H01L 29/6656 |

\* cited by examiner

NEGATIVE CAPACITANCE FIELD EFFECT TRANSISTOR AND METHOD FOR MANUFACTURING THE SAME

The present disclosure claims priority to Chinese Patent Application No. 201910289934.4, titled "NEGATIVE CAPACITANCE FIELD EFFECT TRANSISTOR AND METHOD FOR MANUFACTURING THE SAME," filed on Apr. 11, 2019 with the China National Intellectual Property Administration, the content of which is incorporated herein by reference.

FIELD

The present disclosure relates to the technology field of semiconductor integration, and particularly, to a negative capacitance field effect transistor and a method for manufacturing the negative capacitance field effect transistor.

BACKGROUND

With continuous development of integrated circuits in the future, integration density would increase, and power consumption of the circuits would become more and more important. An important technology lies in reducing an operating voltage VDD continuously and reducing a leakage current of a device. Part of such objective may be achieved with new structures such as GAA (gate-all-ground) techniques. The Boltzmann limit of the sub-threshold swing (SS≥60 mV/dec) for transistors is a crucial technical challenge when the VDD is kept being reduced to below 0.5V. Developing new technologies that can break the SS limitation is an important direction of new technologies in the future.

In addition to the TFET (tunneling field effect transistor) based on quantum tunneling, another way may be applied to reduce the VDD. A ferroelectric capacitance based on a ferroelectric material is integrated in a gate structure, and connected in series with a gate capacitance. A negative capacitance is formed when a ferroelectric domain is inverted, and an internal potential is amplified under suitable operation conditions. Thereby, a surface potential of a transistor is changed when the transistor being switched, the Boltzmann limit is broken, and a large current gain is obtained. Such device is called a negative capacitance field effect transistor (NCFET).

The ferroelectric capacitance $C_{FE}$ in the NCFET and a key material for the $C_{FE}$ play an important role. It is necessary that the material achieves a good ferroelectric effect, and has good stability and reliability. Further, processing is required to be simple and compatible with traditional processes. In conventional technology, ferroelectric materials include lead zirconium titanate (PZT), lead titanate (PbTiO$_3$), lead citrate (PST), barium titanate (BST), polyvinyl fluoride (PVF), polydisperse Fluorine (PVDF), and the like. Such materials require a special process and a certain thickness to exhibit ferroelectricity, and thereby applications thereof are limited given that the CMOS is being extremely miniaturized.

In addition to the above ferroelectric materials, orthorhombic HfO$_2$ crystal can also exhibit ferroelectricity. The orthorhombic HfO$_2$ crystal is simple in structure and compatible with a traditional HkMG (high-k and metallic gate) technique. Thereby, processing is simple, and the HfO$_2$ crystal is more reliable than materials such as PZT. A film thickness required by the HfO$_2$ crystal is smaller under a same ferroelectricity condition. By doping with elements such as Si, Y, Zr, and Al, the ferroelectricity of HfO$_2$ can be greatly improved, and materials with strong polarity such as HfZrO$_x$ (HZO), HfSiO$_x$, and HfAlO$_x$ can be formed.

Taking a PMOS (p-channel metal-oxide-semiconductor field effect transistor) as an example, a process of integrating the ferroelectric HZO material into a transistor structure is generally as follows. A layer of HZO material is grown on a conventional interfacial oxide layer/HfO$_2$ layer (IL/HK) in a post-gate process, where other processes are identical to a conventional process. In a subsequent process, polycrystalline grains are formed by annealing, orthorhombic phases are formed in the polycrystalline grains, thereby exhibiting strong ferroelectric polarity.

Polarity of the aforementioned ferroelectric materials is gradually incapable to satisfy a requirement in continuous development of semiconductor devices. Therefore, it is urgent to provide a method for further increasing polarity of ferroelectric materials in a limited gate space.

SUMMARY

An objective of the present disclosure is to provide a negative capacitance field effect transistor (NCFET) and a method for manufacturing the negative capacitance field effect transistor, so as to improve a polarity of a ferroelectric material in a limited gate space.

In order to achieve the above objective, a negative capacitance field effect transistor is provided according to an embodiment of the present disclosure. The negative capacitance field effect transistor includes: a substrate structure, including a MOS (metal-oxide-semiconductor field effect transistor) region; a gate insulating dielectric structure, covering the MOS region; and a metal gate stack layer, covering the gate insulating dielectric structure. The gate insulating dielectric structure includes an interface oxide layer, a HfO$_2$ layer, a doping material layer, and a ferroelectric material layer, which are sequentially stacked along a direction away from the substrate structure. A ferroelectric material in the ferroelectric material layer is Hf$_x$A$_{1-x}$O$_2$, A represents a doping element, and 0.1≤x≤0.9. A material forming the doping material layer is A$_y$O$_z$ or A, and a ratio of y/z is equal to 1/2, 2/3, 2/5 or 1/1.

In an embodiment, A is one of of Si, Zr, Al, La, or Y.

In an embodiment, a thickness of the doping material layer ranges from 0.1 nm to 5 nm.

In an embodiment, the MOS region includes an NMOS (n-channel MOS) region and a PMOS (p-channel MOS) region.

In an embodiment, the substrate structure is one of a planar structure, a fin structure, or a ring-gate nanowire structure.

According to another aspect of the present disclosure, a method for manufacturing a negative capacitance field effect transistor is provided.

A method for manufacturing a negative capacitance field effect transistor is provided according to another embodiment of the present disclosure. The method includes: providing a substrate structure including a MOS region; forming, sequentially on the substrate structure, an interface oxide layer, a HfO$_2$ layer, a doping material layer, and a ferroelectric material layer, to obtain a gate insulating dielectric structure covering the MOS region; and forming, on the substrate structure, a metal gate stack layer covering the gate insulating dielectric structure. A ferroelectric material in the ferroelectric material layer is Hf$_x$A$_{1-x}$O$_2$, A represents a doping element, and 0.1≤x≤0.9. A material forming the doping material layer is A$_y$O$_z$ or A, and a ratio of y/z is equal to 1/2, 2/3, 2/5 or 1/1.

In an embodiment, A is one of Si, Zr, Al, La, or Y.

In an embodiment, a thickness of the doping material layer ranges from 0.1 nm to 5 nm.

In an embodiment, forming, sequentially on the substrate structure, the interface oxide layer, the $HfO_2$ layer, the doping material layer, and the ferroelectric material layer includes: forming the interface oxide layer on a surface of the substrate structure; depositing $HfO_2$, a doping material, and a ferroelectric material, sequentially on a surface of the interface oxide layer; and annealing to form the $HfO_2$ layer, the doping material layer and the ferroelectric material layer. The doping material is $A_yO_z$ or A.

In one embodiment, the interface oxide layer is a $SiO_2$ layer.

In one embodiment, the interface oxide layer is formed by performing ozone treatment on a surface of the MOS region of the substrate structure.

In one embodiment, the depositing is performed through one of atomic layer deposition, chemical vapor deposition, vacuum physical sputter deposition, or reflow soldering.

In one embodiment, the MOS region includes an NMOS region and a PMOS region. Forming, on the substrate structure, the metal gate stack layer covering the gate insulating dielectric structure includes: depositing a first barrier layer and a first work-function layer, sequentially on the gate insulating dielectric structure; removing a portion of the first work-function layer located at the NMOS region; thinning a portion of the first barrier layer located at the NMOS region; thinning a portion of the first work-function layer located at the PMOS region; depositing a second work-function layer, a second barrier layer, and a conductive filling layer, sequentially on the remaining first barrier layer and the remaining first work-function layer, to form the metal gate stack layer.

The negative capacitance field effect transistor is provided according to embodiments of the present disclosure. The gate insulating dielectric structure in the NCFET includes the $HfO_2$ layer, the $A_yO_z$ (or A) layer, and the $Hf_xA_{1-x}O_2$ layer in sequence.

The $HfO_2$ layer and the $A_yO_z$ (or A) layer on a surface of the $HfO_2$ layer have different crystal lattices. Therefore, changes in a crystal lattice and a grain size of $Hf_xA_{1-x}O_2$ located on the two layers are induced by a lattice strain or a metal element. Thereby, ferroelectric characteristics, material stability, and material reliability of the NCFET are improved by increasing domain polarity of the ferroelectric material.

BRIEF DESCRIPTION OF THE DRAWINGS

The drawings constitute part of the present disclosure, and help further understand the present disclosure. The illustrative embodiments and corresponding description are intended to illustrate the present disclosure, and should not be construed as any impropriate limitation to the present disclosure.

| Numeral references: | |
|---|---|
| 100: substrate structure; | 101: first fin; |
| 102: second fin; | 103: third fin; |
| 104: fourth fin; | 10: interface oxide layer; |
| 20: $HfO_2$ layer; | 30: doping material layer; |
| 40: ferroelectric material layer; | 50: first barrier layer; |
| 60: first work-function layer; | 70: second work-function layer; |
| 80: second barrier layer; | 90: conductive filling layer. |

DETAILED DESCRIPTION

It should be noted that, embodiments of the present disclosure and features of the embodiments may be combined with each other in case of no conflict. Hereinafter the present disclosure is described in detail with reference to the drawings in conjunction with the embodiments.

To make the object, technical solutions and advantages of the present application clearer, hereinafter technical solutions in embodiments of the present disclosure are described clearly and completely in conjunction with the drawings in embodiments of the present closure. Apparently, the described embodiments are only some rather than all of the embodiments of the present disclosure. Any other embodiments obtained based on the embodiments of the present disclosure by those skilled in the art without any creative effort fall within the scope of protection of the present disclosure.

It should be noted that, the relationship terms such as "first", "second" and the like are only used herein to distinguish one entity or operation from another, rather than to necessitate or imply that an actual relationship or order exists between the entities or operations. Furthermore, the terms such as "include", "comprise" or any other variants thereof means to be non-exclusive. Therefore, a process, a method, an article or a device including a series of elements include not only the disclosed elements but also other elements that are not clearly enumerated, or further include inherent elements of the process, the method, the article or the device.

Figure 1:
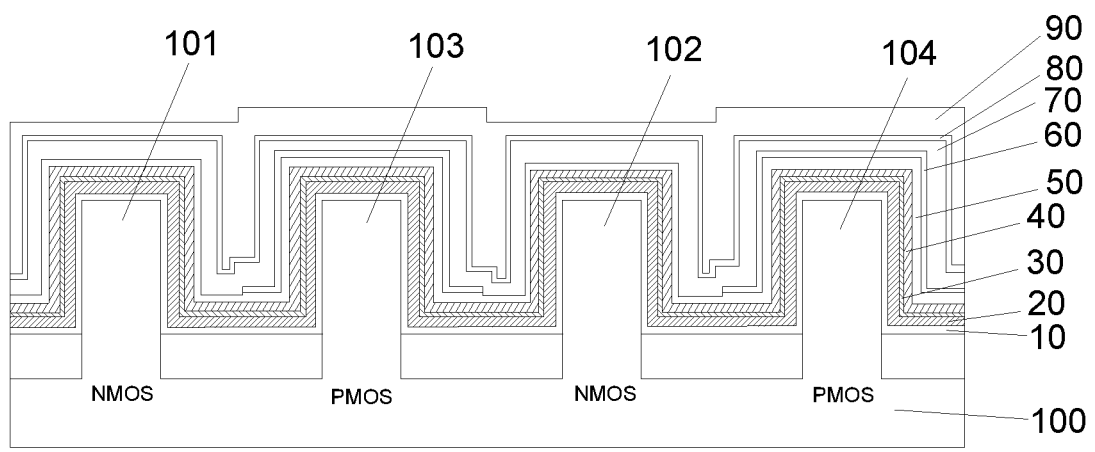
FIG. 1 is a schematic structural diagram of a negative capacitance field effect transistor according to an embodiment of the present disclosure.

As described in the background, it is urgent to provide a method for further increasing polarity of ferroelectric materials in a limited gate space. In order to address the above technical issue, a negative capacitance field effect transistor (NCFET) is provided, as shown in FIG. 1. The negative capacitance field effect transistor includes: a substrate structure 100, including a MOS (metal-oxide-semiconductor field effect transistor) region; a gate insulating dielectric structure, covering the MOS region; and a metal gate stack layer, covering the gate insulating dielectric structure. The gate insulating dielectric structure includes an interface oxide layer 10, a HfO$_2$ layer 20, a doping material layer 30, and a ferroelectric material layer 40, which are sequentially stacked along a direction away from the substrate structure 100. A ferroelectric material in the ferroelectric material layer 40 is Hf$_x$A$_{1-x}$O$_2$, A represents a doping element, and 0.1≤x≤0.9. A material forming the doping material layer is A$_y$O$_z$ or A, and a ratio of y/z is equal to 1/2, 2/3, 2/5 or 1/1.

The gate insulating dielectric structure in the aforementioned NCFET includes the HfO$_2$ layer, a A$_y$O$_z$ (or A) layer and a Hf$_x$A$_{1-x}$O$_2$ layer in sequence. The HfO$_2$ layer and the A$_y$O$_z$ (or A) layer on a surface of the HfO$_2$ layer have different crystal lattices. Therefore, changes in a crystal lattice and a grain size of Hf$_x$A$_{1-x}$O$_2$ located on the two layers are induced by a lattice strain or a metal element. Thereby, ferroelectric characteristics, material stability, and material reliability of the NCFET are improved by increasing domain polarity of the ferroelectric material.

The ferroelectric material in the ferroelectric material layer 40 is Hf$_x$A$_{1-x}$O$_2$, and a material forming the doping material layer 30 is A$_y$O$_z$ or A. In one embodiment, A is one of Si, Zr, Al, La, or Y. In a case that the ferroelectric material layer 40 is an HfZrO$_4$ (HZO) layer, the material forming the doping material layer 30 may be ZrO$_2$ or Zr. In a case that the ferroelectric material layer 40 is an HfSiO$_4$ layer, the material forming the doping material layer may be SiO$_2$ or Si.

In one embodiment, a thickness of the doping material layer ranges from 0.1 nm to 5 nm. With the thickness within said range, not only the doping material layer 30 has a small thickness, but also a lattice parameter and a grain size of Hf$_x$A$_{1-x}$O$_2$ on the doping material layer are effective changed through induction of a lattice strain or a metal element. Thereby, polarity of electric domains of the material is improved.

In one embodiment, the substrate structure 100 may be one of a planar structure, a fin structure, or a ring-gate nanowire structure. A substrate in the substrate structure 100 may be a conventional semiconductor substrate, such as a Si substrate, a Ge substrate, a SiGe substrate, a SOI (Silicon On Insulator), or a GOI (Silicon On Insulator). The MOS region of the substrate structure 100 may include an NMOS (n-channel MOS) region and a PMOS (p-channel MOS) region.

It is taken as an example that the substrate structure 100 is the fin structure. As shown in FIG. 1, the NMOS region is provided with at least a first fin 101 and a second fin 102, and the PMOS region is provided with at least a third fin 103 and a fourth fin 104. In one embodiment, a first barrier layer 50 is located on the NMOS region and the PMOS region. A first work-function layer 60 is located on a portion of the first barrier layer 50 in the PMOS region, and a second work-function layer 70 is located on the first work-function layer 60 and on a portion of the first barrier layer 50 in the NMOS region. A second barrier layer 80 is located on the second work-function layer 70.

A method for manufacturing a negative capacitance field effect transistor is provided according to another embodiment of the present disclosure. The method includes steps S1 to S3. In step S1, a substrate structure is provided, and the substrate structure includes a MOS region. In step S2, an interface oxide layer, a HfO$_2$ layer, a doping material layer and a ferroelectric material layer are sequentially formed on the substrate structure, to obtain a gate insulating dielectric structure covering the MOS region. A ferroelectric material in the ferroelectric material layer is Hf$_x$A$_{1-x}$O$_2$, A is a doping element, and 0.1≤x≤0.9. A material forming the doping material layer is A$_y$O$_z$ or A, and a ratio of y/z is equal to 1/2, 2/3, 2/5 and 1/1. In step S3, a metal gate stack layer covering the gate insulating dielectric structure is formed on the substrate structure.

In the above method for manufacturing the NCFET, the gate insulating dielectric structure in the NCFET includes an HfO$_2$ layer, a A$_y$O$_z$ (or A) layer, and a Hf$_x$A$_{1-x}$O$_2$ layer in sequence. The HfO$_2$ layer and the A$_y$O$_z$ (or A) layer on a surface of the HfO$_2$ layer have different crystal lattices. Therefore, changes in a crystal lattice and a grain size of Hf$_x$A$_{1-x}$O$_2$ located on the two layers are induced by a lattice strain or a metal element. Thereby, ferroelectric characteristics, material stability, and material reliability of the NCFET are improved by increasing domain polarity of the ferroelectric material.

Hereinafter details of a method for manufacturing a negative capacitance field effect transistor are further provided according to embodiments of the present disclosure. The embodiments may be implemented in many different forms, and should not be considered to be limited by what is described herein. It is understood that the embodiments are provided for understanding the present disclosure thoroughly and completely, and conveying the concepts of the embodiments to those skilled in the art.

Figure 2:
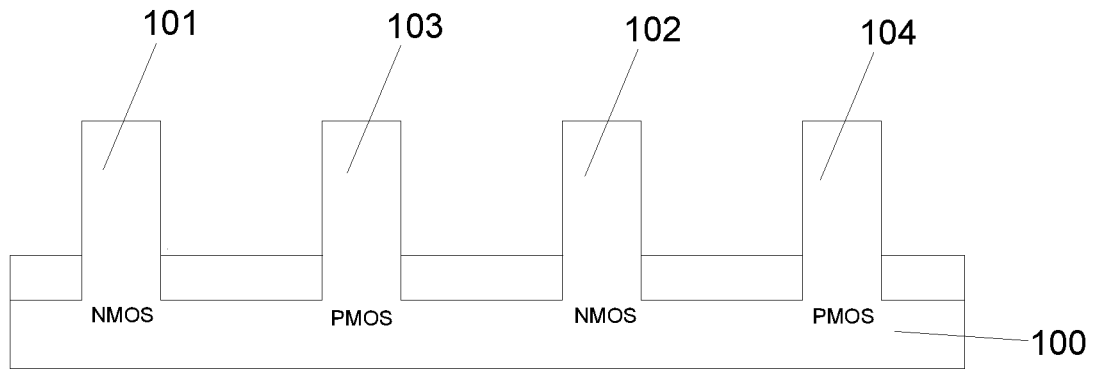
FIG. 2 is a schematic structural diagram of a cross section after providing a substrate structure, in a method for fabricating a negative capacitance field effect transistor according to an embodiment of the present disclosure.

The step S1 is firstly performed. The substrate structure is provided, and the substrate structure includes the MOS region, as shown in FIG. 2. A substrate in the substrate structure 100 may be a conventional semiconductor substrate, such as a Si substrate, a Ge substrate, a SiGe substrate, a SOI (Silicon On Insulator), or a GOI (Silicon On Insulator).

The MOS region may include an NMOS region and a PMOS region. There may be multiple NMOS regions and multiple PMOS regions. The substrate structure 100 provided with the NMOS region and the PMOS region may be a fin structure. In such case, the substrate structure may be provided with multiple fins that each corresponds to the NMOS region or the PMOS region. A process of forming the substrate structure 100 may include following steps. Fins are formed on the substrate, and a device isolation region (Fin STI, shallow trench isolation for fins) is formed. Then, a well region and a channel region of a NMOS and a PMOS are formed through doping, a dummy gate stack crossing the fins is formed, and spacers crossing the fins are formed on two sides of the dummy gate stack. LDD (lightly-doped drain) doping is performed on the NMOS and the PMOS. Source-drain regions of the NMOS and PMOS are doped then annealed, after epitaxy of Si and SiGe, respectively. Afterwards, a first interlayer dielectric (ILD 0) is formed, and the first interlayer dielectric layer is packaged through POP (package-on-package). The dummy gate stack is removed, so as to form multiple NMOS gate trenches and multiple PMOS gate trenches in the first interlayer dielectric layer. Thereby, the NMOS region and the PMOS region provided with fins are obtained.

Figure 3:
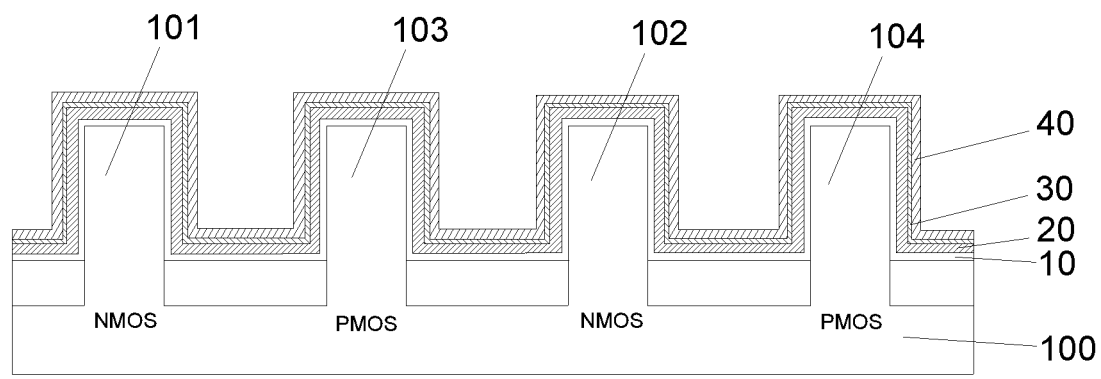
FIG. 3 is a schematic structural diagram of a cross section after forming an interface oxide layer, a $HfO_2$ layer, a doping material layer, and a ferroelectric material layer, sequentially on a substrate structure, on a basis of FIG. 2.

The step S2 is performed after the step S1. The interface oxide layer 10, the HfO$_2$ layer 20, the doping material layer 30, and the ferroelectric material layer 40 are sequentially formed on the substrate structure 100, to obtain the gate insulating dielectric structure covering the MOS region, as shown in FIG. 3. The ferroelectric material in the ferroelectric material layer 40 is Hf$_x$A$_{1-x}$O$_2$, A is the doping element, and 0.1≤x≤0.9. The material forming the doping material layer is A$_y$O$_z$ or A, a ratio of y/z is equal to 1/2, 2/3, 2/5 or 1/1.

In the step S2, the ferroelectric material in the ferroelectric material layer 40 is Hf$_x$A$_{1-x}$O$_2$, and the material forming the doping material layer 30 is $A_yO_z$ or A. In one embodiment, A is any one of Si, Zr, Al, La and Y. In a case that the ferroelectric material layer 40 is an HfZrO$_4$ (HZO) layer, the material forming the doping material layer 30 may be ZrO$_2$ or Zr. In a case that the ferroelectric material layer 40 is an HfSiO$_4$ layer, the material forming the doping material layer may be SiO$_2$ or Si.

In one embodiment, a thickness of the doping material layer 30 ranges from 0.1 nm to 5 nm. With the thickness within said range, not only the doping material layer 30 has a small thickness, but also a lattice parameter and a grain size of Hf$_x$A$_{1-x}$O$_2$ on the doping material layer are effective changed through induction of a lattice strain or a metal element. Thereby, polarity of electric domains of the material is improved.

In one embodiment, the step S2 includes steps S21 and S22. In step S21, the interface oxide layer 10 is formed on a surface of the substrate structure 100. In step S22, HfO$_2$, a doping material, and a ferroelectric material are sequentially deposited on a surface of the interface oxide layer 10, and the HfO$_2$, the doping material, and the ferroelectric material are annealed to form the HfO$_2$ layer, the doping material layer and the ferroelectric material layer. The doping material is $A_yO_z$ or A.

In the step S21, the interface oxide layer 10 may be a SiO$_2$ layer. In such case, the interface oxide layer may be formed by performing ozone treatment on a surface of the MOS region of the substrate structure 100.

In the step S22, a thin layer of $A_yO_z$ (or A) is formed between HfO$_2$ and ferroelectric Hf$_x$A$_{1-x}$O$_2$ through deposition or sputtering. After annealing, Hf$_x$A$_{1-x}$O$_2$ grains with strong ferroelectric polarity are formed by induction of a lattice strain or an element. A process of forming the HfO$_2$ layer 20, the doping material layer 30, and the ferroelectric material layer 40 may be atomic layer deposition (ALD), chemical vapor deposition (CVD), vacuum physical sputter deposition (PVD), or reflow soldering. Those skilled in the art may reasonably select process conditions in forming the aforementioned layers according to conventional technology.

Figure 4:
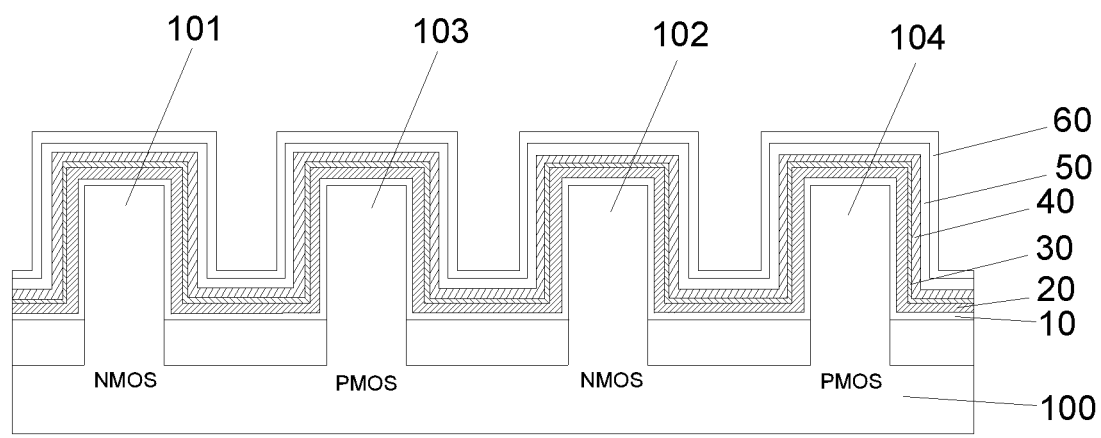
FIG. 4 is a schematic structural diagram of a cross section after depositing a first barrier layer and a first work-function layer sequentially on a gate insulating dielectric structure, on a basis of FIG. 3.
Figure 5:
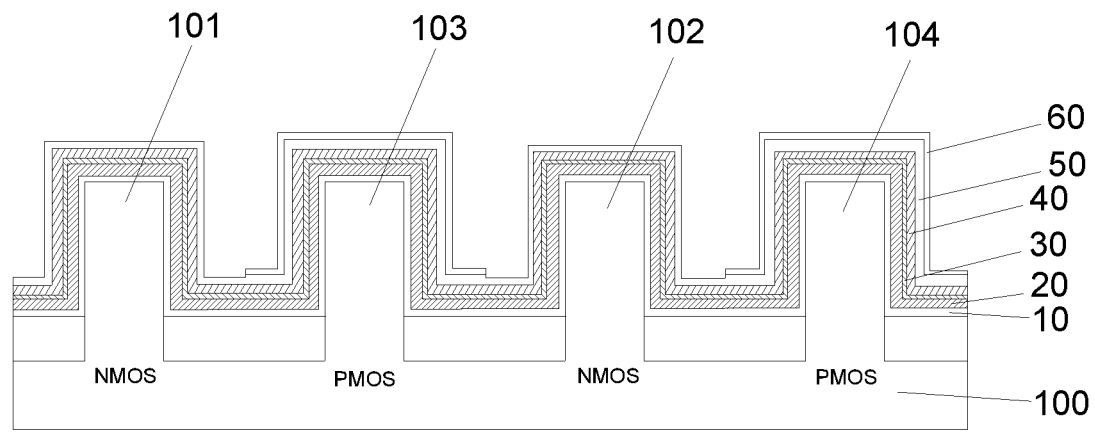
FIG. 5 is a schematic structural diagram of a cross section after removing a portion of the first work-function layer located at the NMOS region, thinning a portion of the first barrier layer located at the NMOS region, and thinning a portion of the first work-function layer located at the PMOS region, on a basis of FIG. 4.
Figure 6:
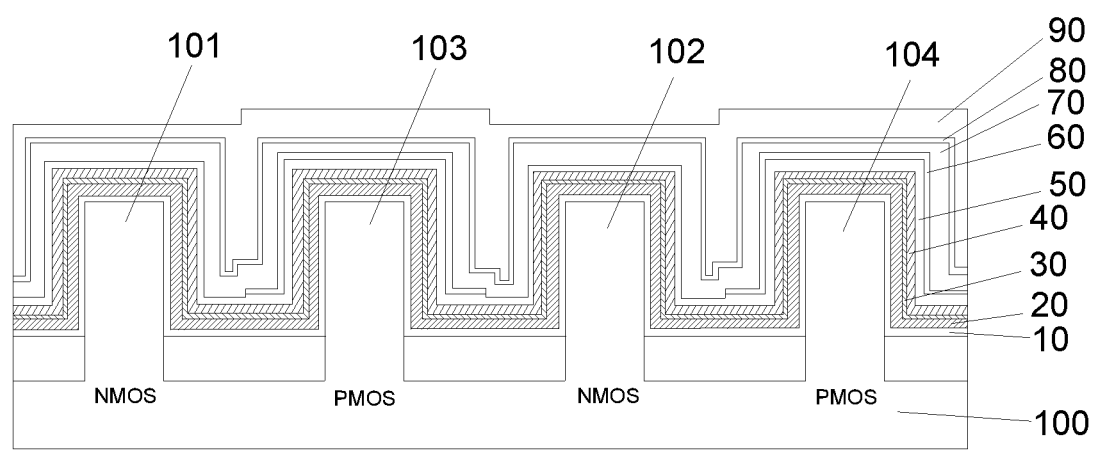
FIG. 6 is a schematic structural diagram of a cross section after depositing a second work-function layer, a second barrier layer, and a conductive filling layer, sequentially on a remaining first barrier layer and a remaining first work-function layer, on a basis of FIG. 5.

The step S3 is performed after the step S2. The metal gate stack layer covering the gate dielectric layer structure is formed on the substrate structure 100, as shown in FIGS. 4 to 6.

The MOS region includes an NMOS region and a PMOS region. In one embodiment, the step S3 includes steps S31 to S33. In step S31, a first barrier layer 50 and a first work-function layer 60 are sequentially deposited on the gate insulating dielectric structure, as shown in FIG. 4. In step S32, a portion of the first work-function layer 60 located at the NMOS region is removed, a portion of the first barrier layer 50 located at the NMOS region is thinned, and a portion of the first work-function layer 60 located at the PMOS region is thinned, as shown in FIG. 5. In step S33, a second work-function layer 70, a second barrier layer 80, and a conductive filling layer 90 are sequentially deposited on the remaining first barrier layer 50 and the remaining first work-function layer 60 to form the metal gate stack layer, as shown in FIG. 6.

In one embodiment, a material forming the first barrier layer 50 and a material forming the second barrier layer 80 may be independently selected to be one or more of TiN, TaN, TiN$_x$, TaN$_x$ and TiNSi, where $0.1 \leq x \leq 0.9$. A material forming the first work-function layer 60 may be one or more of Al, TiAl, TiAl$_x$, TiAlC$_x$, TiC$_x$ and TaC$_x$, where $0.1 \leq x \leq 0.9$. A material forming the second work-function layer 70 may be any one kind or multiple kinds from TiN, TaN, TiN$_x$, TaN$_x$ and TiNSi, where $0.1 \leq x \leq 0.9$. Those skilled in the art may reasonably select a deposition process and a process condition for forming these layers according to conventional technology.

In one embodiment, a material forming the conductive filling layer 90 may be one or more W, Ni, Ti, and Co. The conductive filling layer 90 may be deposited through one of atomic layer deposition, chemical vapor deposition, or vacuum physical sputter deposition.

In one embodiment, removing techniques for the first barrier layer 50, the first work-function layer 60, and the second work-function layer 70 may be independently selected from dry etching, wet etching, ashing, and peeling.

After the step S33, the metal gate stack layer may be polished through chemical mechanical polishing (CMP), to smooth a top surface of the metal gate structure.

After the step S3, the method may further include interconnecting devices. The interconnecting may include following steps. A second interlayer dielectric (ILD 1) is deposited, a metal layer (CT) and a silicide layer are formed, a tungsten plug (W plug) is formed, and chemical mechanical polishing is performed. Then, multiple layers are interconnected, and a pad in a passivation layer is formed.

These embodiments of the present disclosure achieves following technical effects.

In the NCFET, the gate insulating dielectric structure in the NCFET includes the HfO$_2$ layer, the $A_yO_z$ (or A) layer, and the HfA$_{1-x}$O$_2$ layer in sequence. The HfO$_2$ layer and the $A_yO_z$ (or A) layer on a surface of the HfO$_2$ layer have different crystal lattices. Therefore, changes in a crystal lattice and a grain size of Hf$_x$A$_{1-x}$O$_2$ located on the two layers are induced by a lattice strain or a metal element. Thereby, ferroelectric characteristics, material stability, and material reliability of the NCFET are improved by increasing domain polarity of the ferroelectric material.

The foregoing embodiments are only preferred embodiments of the present disclosure, and do not limit the present disclosure in any form. Those skilled in the art can make variations and improvements to the technical solutions of the present disclosure. All modifications, equivalent variations and improvements made based on the spirit and principles of the present disclosure without fall within the protection scope of the present disclosure.

The invention claimed is:

1. A negative capacitance field effect transistor, comprising:
    a substrate structure, comprising a MOS (metal-oxide-semiconductor field effect transistor) region;
    a gate insulating dielectric structure, covering the MOS region; and
    a metal gate stack layer, covering the gate insulating dielectric structure;
    wherein the gate insulating dielectric structure comprises an interface oxide layer, a HfO$_2$ layer, a doping material layer, and a ferroelectric material layer, which are sequentially stacked along a direction away from the substrate structure;
    wherein a ferroelectric material in the ferroelectric material layer is Hf$_x$A$_{1-x}$O$_2$, A represents a doping element, and $0.1 \leq x \leq 0.9$; and
    wherein a material forming the doping material layer is $A_yO_z$ or A, and a ratio of y/z is equal to 1/2, 2/3, 2/5 or 1/1.

2. The negative capacitance field effect transistor according to claim 1, wherein A is one of Si, Zr, Al, La, or Y.

3. The negative capacitance field effect transistor according to claim 1, wherein a thickness of the doping material layer ranges from 0.1 nm to 5 nm.

4. The negative capacitance field effect transistor according to claim 1, wherein the MOS region comprises an NMOS (n-channel MOS) region and a PMOS (p-channel MOS) region.

5. The negative capacitance field effect transistor according to claim 2, wherein the MOS region comprises an NMOS (n-channel MOS) region and a PMOS (p-channel MOS) region.

6. The negative capacitance field effect transistor according to claim 3, wherein the MOS region comprises an NMOS (n-channel MOS) region and a PMOS (p-channel MOS) region.

7. The negative capacitance field effect transistor according to claim 1, wherein the substrate structure is one of a planar structure, a fin structure, or a ring-gate nanowire structure.

8. The negative capacitance field effect transistor according to claim 2, wherein the substrate structure is one of a planar structure, a fin structure, or a ring-gate nanowire structure.

9. The negative capacitance field effect transistor according to claim 3, wherein the substrate structure is one of a planar structure, a fin structure, or a ring-gate nanowire structure.

10. The negative capacitance field effect transistor according to claim 1, wherein:
   the interface oxide layer is located on a surface of the substrate structure;
   the $HfO_2$ layer is located on a surface of the interface oxide layer away from the substrate structure;
   the doping material covers a surface of the $HfO_2$ layer away from the substrate structure; and
   the ferroelectric material layer covers a surface of the doping material layer away from the substrate structure.

11. The negative capacitance field effect transistor according to claim 1, wherein the interface oxide layer is a $SiO_2$ layer.

12. The negative capacitance field effect transistor according to claim 5, wherein:
   the metal gate stack layer comprises a first barrier layer located on the gate insulating dielectric structure, a second work-function layer located on the first barrier layer, a second barrier layer located on the second work-function layer, and the conductive layer located on the second barrier layer; and
   at the PMOS region, the metal gate stack layer further comprises a first work-function layer located between the second work-function layer and the first barrier layer.

13. The negative capacitance field effect transistor according to claim 6, wherein:
   the metal gate stack layer comprises a first barrier layer located on the gate insulating dielectric structure, a second work-function layer located on the first barrier layer, a second barrier layer located on the second work-function layer, and the conductive layer located on the second barrier layer; and
   at the PMOS region, the metal gate stack layer further comprises a first work-function layer located between the second work-function layer and the first barrier layer.

* * * * *